United States Patent
Averill, III et al.

(10) Patent No.: US 9,892,222 B1
(45) Date of Patent: Feb. 13, 2018

(54) AUTOMATED ATTRIBUTE PROPAGATION AND HIERARCHICAL CONSISTENCY CHECKING FOR NON-STANDARD EXTENSIONS

(71) Applicant: INTERNATIONAL BUSINESS MACHINES CORPORATION, Armonk, NY (US)

(72) Inventors: Robert M. Averill, III, Wappingers Falls, NY (US); Erwin Behnen, Austin, TX (US); David S. Wolpert, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/234,250

(22) Filed: Aug. 11, 2016

(51) Int. Cl.
*G06F 9/455* (2006.01)
*G06F 17/50* (2006.01)

(52) U.S. Cl.
CPC ............... *G06F 17/5045* (2013.01)

(58) Field of Classification Search
USPC ........................................... 716/106
See application file for complete search history.

(56) References Cited

U.S. PATENT DOCUMENTS

| | | | |
|---|---|---|---|
| 5,790,841 A * | 8/1998 | Scherer | G06F 17/5077 713/503 |
| 6,668,362 B1 | 12/2003 | McIlwain et al. | |
| 7,240,316 B2 | 7/2007 | Regnier | |
| 7,805,698 B1 | 9/2010 | Ferguson et al. | |
| 2006/0200789 A1 | 9/2006 | Rittman | |
| 2009/0313596 A1* | 12/2009 | Lippmann | G06F 17/505 716/126 |
| 2010/0058275 A1 | 3/2010 | Polomik et al. | |

OTHER PUBLICATIONS

List of IBM Patents or Patent Applications Treated as Related; Date Filed: Aug. 11, 2016, pp. 1-2.
Robert M. Averill, et al.,"Automated Attribute Propagation and Hierarchical Consistency Checking for Non-Standard Extensions", U.S. Appl. No. 15/430,864, filed Feb. 13, 2017.
Silvaco, Inc., "What's New in the 2010 Baseline," http://www.silvaco.com/products/newFeatures/whats_new_2010.pdf, Jul. 2010, pp. 1-42.
The University of Utah, "Design Compiler—Basic Flow," "Synopsys design compiler Cadence Encounter Digital Implementation System (EDI)," http://www.eng.utah.edu/~cs6710/slides/cs6710-syn-socx6.pdf, Oct. 23, 2006, pp. 1-12.

* cited by examiner

*Primary Examiner* — Eric Lee
(74) *Attorney, Agent, or Firm* — Cantor Colburn LLP; Margaret A. McNamara

(57) ABSTRACT

Examples of techniques for automated attribute propagation and hierarchical consistency checking are disclosed. In one example implementation according to aspects of the present disclosure, a computer-implemented method may include: detecting, by a processor, a non-standard extension during convergence of an integrated circuit logic design; propagating, by the processor, the non-standard extension to each level of a plurality of hierarchies of the integrated circuit design for which a net utilizes a special constraint; and verifying, by the processor, a hierarchy consistency across each level of the plurality of hierarchies.

10 Claims, 5 Drawing Sheets

AUTOMATED ATTRIBUTE PROPAGATION AND HIERARCHICAL CONSISTENCY CHECKING FOR NON-STANDARD EXTENSIONS

BACKGROUND

The present disclosure relates to integrated circuit design and, more particularly, to techniques for automated attribute propagation and hierarchical consistency checking for non-standard extensions.

During checking of an integrated circuit during the design phase of the integrated circuit, hardware defects or failures may be automatically detected. However, some hardware defects or failures may not be automatically detected using existing techniques and instead are only detectable by labor intensive manual review of data. For example, an analog signal wire may be passed through a digital buffer. This type of defect or failure is undetectable by existing automated techniques. Instead, manual check is performed, but this manual process is time-consuming and error-prone and consumes a significant number of man-hours.

SUMMARY

According to examples of the present disclose, techniques including methods, systems, and/or computer program products for automated attribute propagation and hierarchical consistency checking are provided. In one example, a computer-implemented method includes: detecting, by a processor, a non-standard extension during convergence of an integrated circuit logic design; propagating, by the processor, the non-standard extension to each level of a plurality of hierarchies of the integrated circuit design for which a net utilizes a special constraint; and verifying, by the processor, a hierarchy consistency across each level of the plurality of hierarchies.

Additional features and advantages are realized through the techniques of the present disclosure. Other aspects are described in detail herein and are considered a part of the disclosure. For a better understanding of the present disclosure with the advantages and the features, refer to the following description and to the drawings.

BRIEF DESCRIPTION OF THE DRAWINGS

The subject matter which is regarded as the invention is particularly pointed out and distinctly claimed in the claims at the conclusion of the specification. The foregoing and other features, and advantages thereof, are apparent from the following detailed description taken in conjunction with the accompanying drawings in which:

DETAILED DESCRIPTION

Figure 1:
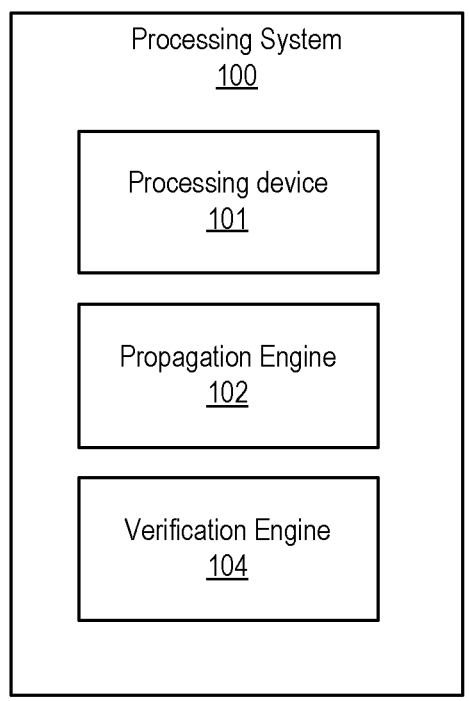
FIG. 1 illustrates a block diagram of a processing system for automated attribute propagation and hierarchical consistency checking for non-standard extensions according to examples of the present disclosure.

Various tools may be utilized to track the billions of transistors and hundreds of thousands of nets on a chip during design and testing. However, the tracking is complicated by special cases. For example, an analog signal may need to be manually routed because the tracking tools are unable to track the analog signal. If a digital buffer is added to an analog signal, the analog signal is improperly changed. For example, if an inverter is added to the analog signal by a tracking tool, for example, the signal is effectively killed because the analog signal is forced to a 0 or 1. Current tracking tools are unable to trace the analog signals to determine if a digital buffer has been added.

To avoid these issues, the present techniques provide an infrastructure to track this information such that, instead of a list that must be manually inspected, a set of properties are added at each level of hierarchy within the integrated circuit. Examples of levels of hierarchy may include a transistor, a macro cell or macro (i.e., a group of transistors), a unit (i.e., a group of macro cells), a chip (i.e., a group of units), etc. The present techniques provide a multi-purpose per-macro repository that sits alongside design data that: is human readable, searchable, and available to various tools; that matches properties in the logic to properties in the final layout; and applies properties consistently across the design hierarchy.

In one prior situation, application specific integrated circuits (ASICs) were found to have a mechanism for tracking and verifying similar behavior that traveled with their data by using non-standard extensions. However, this approached used lots of overhead and complexity. For example, properties were entered by designers into a web database and then converted into .xml format for use by checking tools and into .tcl format for export to customers. A "MustConnect" property was placed on a pin instance whose value is the name of another pin instance, and checks are used to ensure that the pins are directly connected, with no intervening cells. However, this approach was found to be insufficient to provide functionality to prevent buffering across hierarchy with a more generic property that could be attached to a macro cell for more general use.

Various implementations are described below by referring to several examples of automated attribute propagation and hierarchical consistency checking for non-standard extensions. In particular, the present techniques provide an automated data propagation framework. This ensures that properties travel from logic to layout and that associated requirements are followed at each stage in the design of the integrated circuit. To do this, a new property is used called "No Buffer" that prevents buffers from landing on analog lines and destroying the analog signal. Moreover, the present techniques provide verification of property propagation at each layer of hierarchy and across hierarchical boundaries. This ensures that design requirements are followed from the standard cell level all the way to the chip level.

Example embodiments of the disclosure include or yield various technical features, technical effects, and/or improvements to technology. For instance, example embodiments of the disclosure provide the technical effect of improving the functioning of a chip (integrated circuit) by propagating data across the chip design hierarchy to enable attributes/properties travel from logic to layout. In this way, the functioning of the chip is improved, for example, by preventing hardware failures. For example, the present techniques improve the chip design by preventing the situation where an analog signal wire is passed through a digital buffer. As a result of these technical features and technical effects, example embodiments of the disclosure constitute an improvement to existing computing resource management technology. It should be appreciated that the above examples of technical features, technical effects, and improvements to technology of example embodiments of the disclosure are merely illustrative and not exhaustive. These and other advantages will be apparent from the description that follows.

FIG. 1 illustrates a block diagram of a processing system for automated attribute propagation and hierarchical consistency checking for non-standard extensions according to examples of the present disclosure. The various components, modules, engines, etc. described regarding FIG. 1 may be implemented as instructions stored on a computer-readable storage medium, as hardware modules, as special-purpose hardware (e.g., application specific hardware, application specific integrated circuits (ASICs), as embedded controllers, hardwired circuitry, etc.), or as some combination or combinations of these. In examples, the engine(s) described herein may be a combination of hardware and programming. The programming may be processor executable instructions stored on a tangible memory, and the hardware may include a processing device 101 for executing those instructions. Thus a system memory can store program instructions that when executed by the processing device 101 implement the engines described herein. Other engines may also be utilized to include other features and functionality described in other examples herein.

Processing system 100 may include a processing device 101, a propagation engine 102, and a verification engine 104. Alternatively or additionally, the processing system 100 may include dedicated hardware, such as one or more integrated circuits, Application Specific Integrated Circuits (ASICs), Application Specific Special Processors (ASSPs), Field Programmable Gate Arrays (FPGAs), or any combination of the foregoing examples of dedicated hardware, for performing the techniques described herein.

The propagation engine 102 executes a data procedure, such as data procedure 200 described below to propagate that attributes/properties, such as non-standard extensions, pass from the logic design to the physical design. In particular, the propagation engine 102 ensures that properties travel from logic to layout and that associated requirements are followed at each stage in the design of the integrated circuit. For example, a logic designer may indicate that a net is a special net that includes a non-standard extension. The propagation engine 102 passes the special net infrastructure from the logic designer automatically to the physical designer. Accordingly, the tools that the physical designer uses (e.g., a buffering tool) receive the special net information and apply it properly to the physical design. In essence, the propagation engine 102 passes special net infrastructure information from the logic design to the physical design. The data procedure is described in more detail below with reference to FIG. 2A.

The verification engine 104 executes a checking procedure, such as checking procedure 200 described below, to ensure that the logic properly propagates across the hierarchy of the chip. For example, this provides that everything in the logic design passes to the physical design and that all tools used by the physical designer perform the right functions and that the special nets are correctly followed. The checking procedure is described in more detail below with reference to FIG. 2B.

Figure 2A:
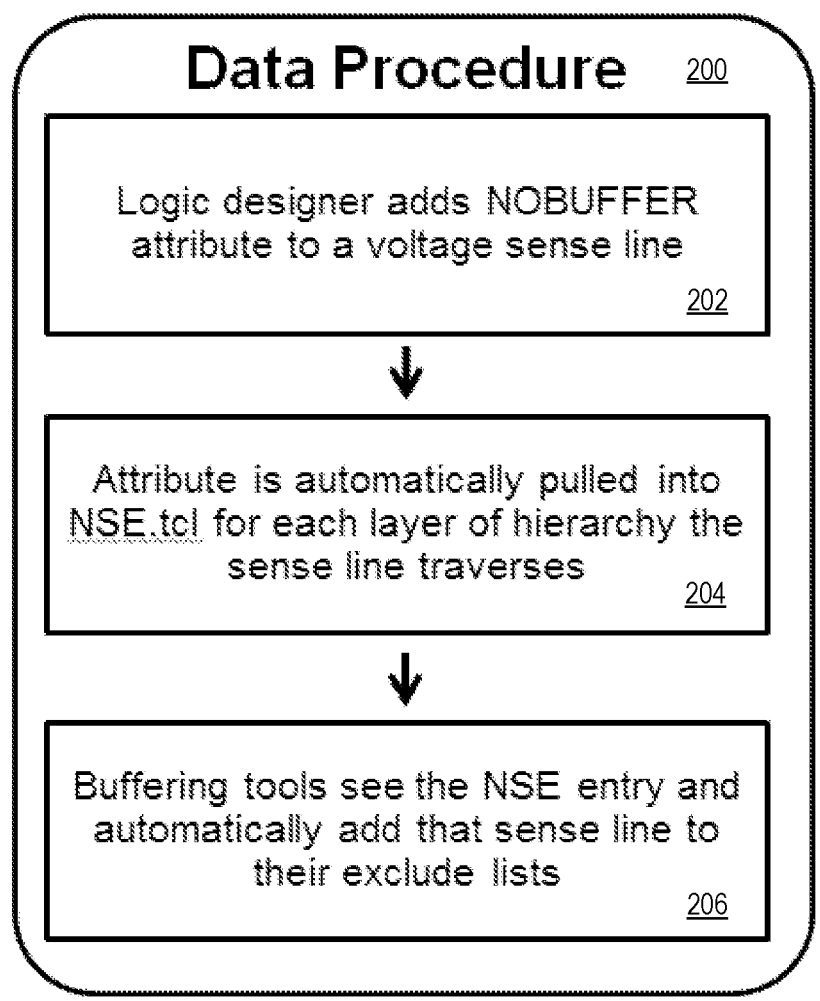
FIG. 2A illustrates a flow diagram of a data procedure for automated attribute propagation and hierarchical consistency checking for non-standard extensions according to examples of the present disclosure.

FIG. 2A illustrates a flow diagram of a data procedure 200 for automated attribute propagation and hierarchical consistency checking for non-standard extensions according to examples of the present disclosure. The data procedure 200 may be performed, for example, by any suitable processing system, such as the processing system 100 of FIG. 1 and/or by the processing system 20 of FIG. 4.

At block 202, a logic designer adds a "NoBuffer" attribute to a voltage sense line.

At block 204, the "NoBuffer" attribute is automatically stored into a non-standard extensions file (i.e., "NSE.tcl") as a non-standard extension entry for each layer of hierarchy that the voltage sense line traverses. At each individual layer of the hierarchy, the file indicates which pins should receive the "NoBuffer" attribute.

At block 206, buffering tools see the non-standard extension entry and automatically adds the corresponding voltage sense line to an exclusion list so that the buffering tools exclude the voltage sense line that corresponds to the non-standard extension entry. For example, a tool may be used to ensure that a delay is met so that two signals arrive at a logic gate at the same time. This ensures that the two delays match. In another example, a buffering tool may look at the resistance and/or capacitance on a shape. So, if there is a long line in the circuit, the signal will degrade along the line, and the buffering tool will detect that the signal is no longer recognizable, so the buffering tool recognizes that a buffer should be inserted to regenerate the signal. In this way, the buffer acts as a repeater. In additional examples, other types of tools may be used, such as timing tool. For example, one net may need to be timed with a particular clock phase.

Figure 2B:
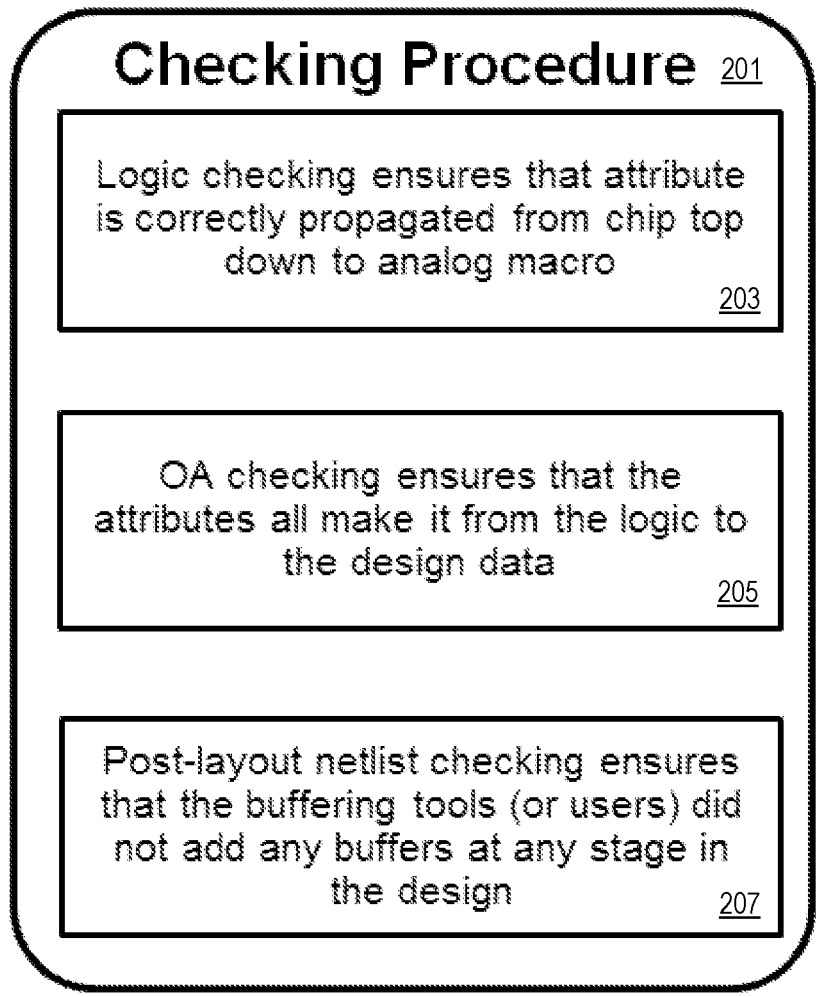
FIG. 2B illustrates a flow diagram of a checking procedure for automated attribute propagation and hierarchical consistency checking for non-standard extensions according to examples of the present disclosure.

In some examples, as illustrated in FIG. 2B, the blocks of the data procedure 200 are tied to a checking procedure 201. At block 203, the checking procedure 201 ensures that the attribute is correctly propagated throughout the hierarchy (i.e., from the chip level down to the macro level). For example, the checking procedure 201 checks the attribute propagation at each level of the hierarchy, so that each level (which abstracts the lower levels) is checked. This ensures that the attribute is correctly propagated from the transistor level to the macro level to the unit level and to the chip level, etc.

At block 205 of the checking procedure 201, open access (OA), which represents a data type, checking is performed to ensure that the attributes all make it from logic to design. This verifies that the attributes carry from the logic design level (code level) to the circuit/physical design level.

At block 207, the checking procedure 201 performs a post-layout netlist checking to ensure that the buffering tools (or users) did not add any buffers at any stage in the design.

Figure 4:
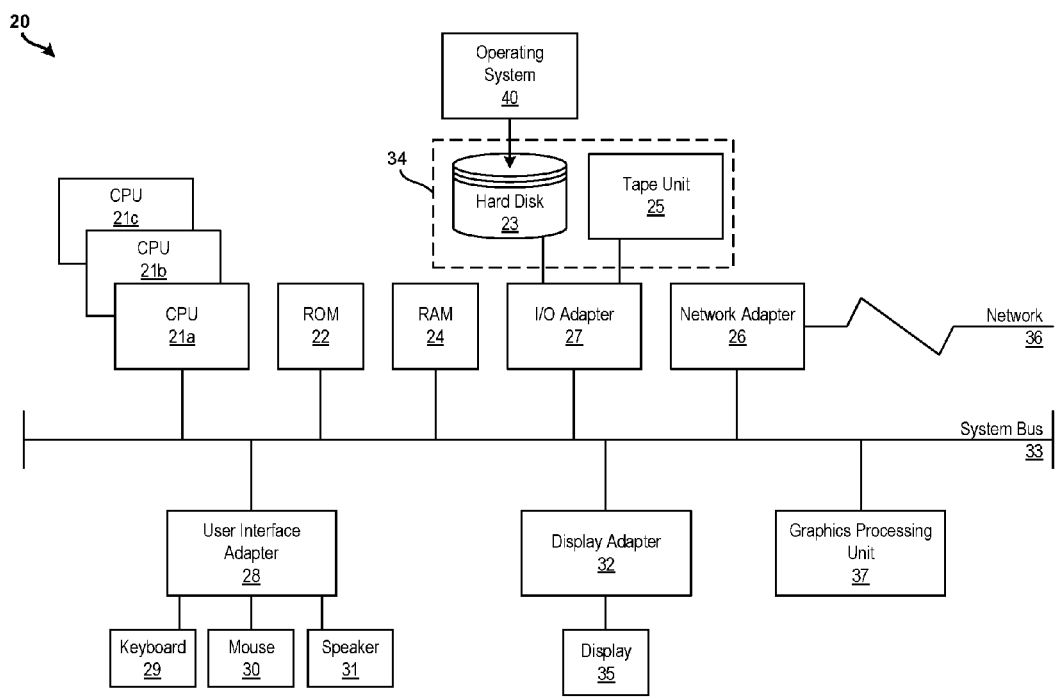
FIG. 4 illustrates a block diagram of a processing system for implementing the techniques described herein according to examples of the present disclosure.

It should be appreciated that the checking procedure 201 may be performed, for example, by any suitable processing system, such as the processing system 100 of FIG. 1 and/or by the processing system 20 of FIG. 4. Additional processes also may be included, and it should be understood that the processes depicted in FIGS. 2A and 2B represent illustrations, and that other processes may be added or existing processes may be removed, modified, or rearranged without departing from the scope and spirit of the present disclosure.

Figure 3:
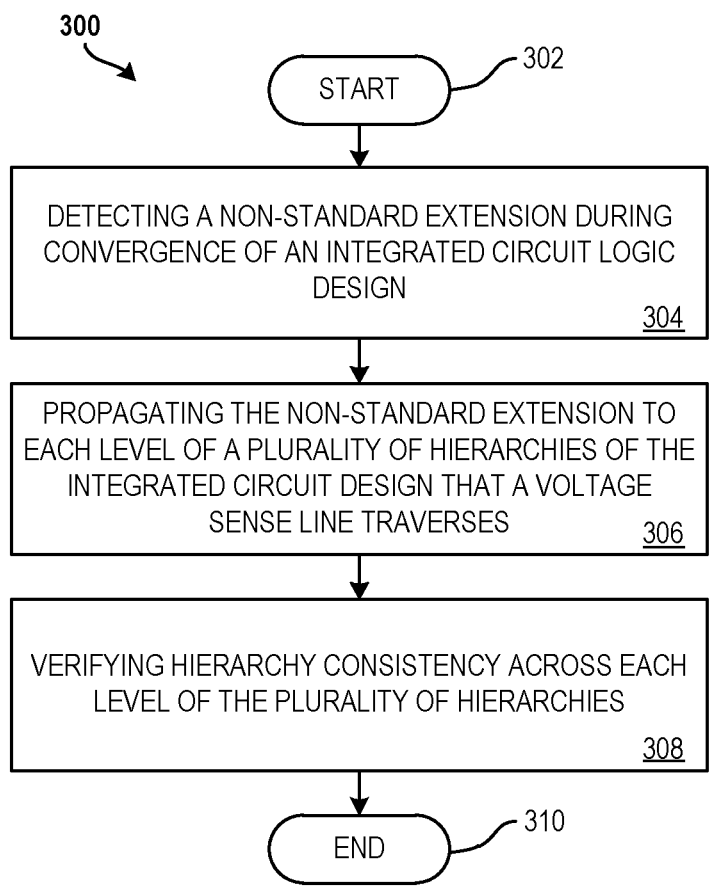
FIG. 3 illustrates a flow diagram of a method 300 for automated attribute propagation and hierarchical consistency checking for non-standard extensions according to examples of the present disclosure.

FIG. 3 illustrates a flow diagram of a method 300 for automated attribute propagation and hierarchical consistency checking for non-standard extensions according to examples of the present disclosure. The method 300 may be performed, for example, by any suitable processing system, such as the processing system 100 of FIG. 1 and/or by the processing system 20 of FIG. 4. The method 300 starts at block 302 and continues to block 304.

At block 304, the method 300 includes detecting, by a processor (e.g., the processing device 101), a non-standard extension during the convergence of an integrated circuit logic design. In examples, detecting a non-standard extension includes a logic designer adding a NOBUFFER attribute to a voltage sense line in the integrated circuit design.

At block 306, the method 300 includes propagating, by the processor, the non-standard extension to each level of a plurality of hierarchies of the integrated circuit design for which a net utilizes a special constraint. This may include propagating the non-standard extension to each level of the plurality of hierarchies of the integrated circuit design that a voltage sense line traverses. In examples, propagating the non-standard extension includes saving the non-standard attribute into a file. In examples, the special constraint may include a noise requirement, a timing requirement, a static voltage requirement, and/or a transient voltage requirement.

At block 308, the method 300 includes verifying, by the processor, a hierarchy consistency across each level of the plurality of hierarchies. In examples, verifying the hierarchy consistency includes checking to ensure that the non-standard extension is correctly propagated through each of the plurality of hierarchies. In additional examples, verifying the hierarchy consistency includes checking to ensure that the non-standard extension transfers from the integrated circuit logic design to a physical design for the integrated circuit. In additional examples, verifying the hierarchy consistency includes performing a post-layout checking to ensure that a buffering tool did not add any additional buffers to the physical design for the integrated circuit. The buffering tool may include a buffering tool, a timing tool, and/or a delay tool. At block 310, the method 300 concludes.

Additional processes also may be included, and it should be understood that the processes depicted in FIG. 3 represent illustrations, and that other processes may be added or existing processes may be removed, modified, or rearranged without departing from the scope and spirit of the present disclosure.

It is understood in advance that the present disclosure is capable of being implemented in conjunction with any other type of computing environment now known or later developed. For example, FIG. 4 illustrates a block diagram of a processing system 20 for implementing the techniques described herein. In examples, processing system 20 has one or more central processing units (processors) 21*a*, 21*b*, 21*c*, etc. (collectively or generically referred to as processor(s) 21 and/or as processing device(s)). In aspects of the present disclosure, each processor 21 may include a reduced instruction set computer (RISC) microprocessor. Processors 21 are coupled to system memory (e.g., random access memory (RAM) 24) and various other components via a system bus 33. Read only memory (ROM) 22 is coupled to system bus 33 and may include a basic input/output system (BIOS), which controls certain basic functions of processing system 20.

Further illustrated are an input/output (I/O) adapter 27 and a communications adapter 26 coupled to system bus 33. I/O adapter 27 may be a small computer system interface (SCSI) adapter that communicates with a hard disk 23 and/or a tape storage drive 25 or any other similar component. I/O adapter 27, hard disk 23, and tape storage device 25 are collectively referred to herein as mass storage 34. Operating system 40 for execution on processing system 20 may be stored in mass storage 34. A network adapter 26 interconnects system bus 33 with an outside network 36 enabling processing system 20 to communicate with other such systems.

A display (e.g., a display monitor) 35 is connected to system bus 33 by display adaptor 32, which may include a graphics adapter to improve the performance of graphics intensive applications and a video controller. In one aspect of the present disclosure, adapters 26, 27, and/or 32 may be connected to one or more I/O busses that are connected to system bus 33 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 33 via user interface adapter 28 and display adapter 32. A keyboard 29, mouse 30, and speaker 31 may be interconnected to system bus 33 via user interface adapter 28, which may include, for example, a Super I/O chip integrating multiple device adapters into a single integrated circuit.

In some aspects of the present disclosure, processing system 20 includes a graphics processing unit 37. Graphics processing unit 37 is a specialized electronic circuit designed to manipulate and alter memory to accelerate the creation of images in a frame buffer intended for output to a display. In general, graphics processing unit 37 is very efficient at manipulating computer graphics and image processing, and has a highly parallel structure that makes it more effective than general-purpose CPUs for algorithms where processing of large blocks of data is done in parallel.

Thus, as configured herein, processing system 20 includes processing capability in the form of processors 21, storage capability including system memory (e.g., RAM 24), and mass storage 34, input means such as keyboard 29 and mouse 30, and output capability including speaker 31 and display 35. In some aspects of the present disclosure, a portion of system memory (e.g., RAM 24) and mass storage 34 collectively store an operating system such as the AIX® operating system from IBM Corporation to coordinate the functions of the various components shown in processing system 20.

The present techniques may be implemented as a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some examples, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to aspects of the present disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various aspects of the present disclosure. In this regard, each block in the flowchart or block diagrams may represent a module, segment, or portion of instructions, which comprises one or more executable instructions for implementing the specified logical function (s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various examples of the present disclosure have been presented for purposes of illustration, but are not intended to be exhaustive or limited to the embodiments disclosed. Many modifications and variations will be apparent to those of ordinary skill in the art without departing from the scope and spirit of the described techniques. The terminology used herein was chosen to best explain the principles of the present techniques, the practical application or technical improvement over technologies found in the marketplace, or to enable others of ordinary skill in the art to understand the techniques disclosed herein.

What is claimed:

1. A system for automated attribute propagation and hierarchical consistency checking, the system comprising:
   a memory having computer readable instructions; and
   a processing device for executing the computer readable instructions, the computer readable instructions comprising:
      detecting a non-standard extension during convergence of an integrated circuit logic design, wherein detecting a non-standard extension comprises a NOBUFFER attribute being added to a voltage sense line in the integrated circuit design;
      propagating the non-standard extension to each level of a plurality of hierarchies of the integrated circuit design for which a net utilizes a special constraint; and
      verifying a hierarchy consistency across each level of the plurality of hierarchies,
      wherein the NOBUFFER attribute is stored into a non-standard extensions file for each level of the plurality of hierarchies that the voltage sense line traverses, and wherein the non-standard extensions file indicates which of a plurality of pins should receive the NOBUFFER attribute for each level of the plurality of hierarchies, and wherein an integrated circuit is manufactured using the integrated circuit design.

2. The system of claim 1, wherein detecting a non-standard extension comprises a logic designer adding the NOBUFFER attribute to the voltage sense line in the integrated circuit design.

3. The system of claim 1, wherein verifying the hierarchy consistency further comprises checking to ensure that the non-standard extension is correctly propagated through each of the plurality of hierarchies.

4. The system of claim 3, wherein verifying the hierarchy consistency further comprises checking to ensure that the non-standard extension transfers from the integrated circuit logic design to a physical design for the integrated circuit.

5. The system of claim 4, wherein verifying the hierarchy consistency further comprises performing a post-layout checking to ensure that a buffering tool did not add any additional buffers to the physical design for the integrated circuit.

6. The system of claim 5, wherein the buffering tool comprises at least one of a buffering tool, a timing tool, and a delay tool.

7. The system of claim 1, wherein the special constraint comprises at least one of a noise requirement, a timing requirement, a static voltage requirement, and a transient voltage requirement.

8. A computer program product for automated attribute propagation and hierarchical consistency checking, the computer program product comprising:

a non-transitory computer readable storage medium having program instructions embodied therewith, the program instructions executable by a processing device to cause the processing device to:

detect a non-standard extension during convergence of an integrated circuit logic design, wherein detecting a non-standard extension comprises a NOBUFFER attribute being added to a voltage sense line in the integrated circuit design;

propagate the non-standard extension to each level of a plurality of hierarchies of the integrated circuit design for which a net utilizes a special constraint; and verify a hierarchy consistency across each level of the plurality of hierarchies, wherein the NOBUFFER attribute is stored into a non-standard extensions file for each level of the plurality of hierarchies that the voltage sense line traverses, and wherein the non-standard extensions file indicates which of a plurality of pins should receive the NOBUFFER attribute for each level of the plurality of hierarchies, and wherein an integrated circuit is manufactured using the integrated circuit design.

9. The computer program product of claim 8, wherein detecting a non-standard extension comprises a logic designer adding the NOBUFFER attribute to the voltage sense line in the integrated circuit design.

10. The computer program product of claim 8, wherein verifying the hierarchy consistency further comprises:

checking to ensure that the non-standard extension is correctly propagated through each of the plurality of hierarchies;

checking to ensure that the non-standard extension transfers from the integrated circuit logic design to a physical design for the integrated circuit; and performing a post-layout checking to ensure that a buffering tool did not add any additional buffers to the physical design for the integrated circuit, wherein the buffering tool comprises at least one of a buffering tool, a timing tool, and a delay tool.

\* \* \* \* \*